United States Patent [19]
Yamamoto

[11] Patent Number: 5,446,407
[45] Date of Patent: Aug. 29, 1995

[54] TRIMMING CIRCUIT

[75] Inventor: Takeshi Yamamoto, Tokyo, Japan

[73] Assignee: Kabushiki Kaisha Toshiba, Kawasaki, Japan

[21] Appl. No.: 141,974

[22] Filed: Oct. 28, 1993

[30] Foreign Application Priority Data

Oct. 28, 1992 [JP] Japan .................................. 4-289911

[51] Int. Cl.6 ............................................. H02H 7/20
[52] U.S. Cl. ....................................... 327/525; 323/354; 257/529
[58] Field of Search .................... 307/202.1, ; 323/354; 330/261, 307; 257/529, 577, 551; 327/525

[56] References Cited

U.S. PATENT DOCUMENTS

| | | | |
|---|---|---|---|
| 4,412,241 | 10/1983 | Nelson | 307/202.1 |
| 4,689,494 | 8/1987 | Chen | 307/202.1 |
| 4,713,599 | 12/1987 | Davis | 323/312 |
| 4,766,366 | 8/1988 | Davis | 323/354 |
| 5,055,902 | 10/1991 | Lambert | 357/41 |
| 5,079,516 | 1/1992 | Russell et al. | 330/261 |
| 5,124,596 | 6/1992 | Wucer | 307/202.1 |
| 5,321,322 | 6/1994 | Verheyen | 307/202.1 |

FOREIGN PATENT DOCUMENTS 0472065  2/1992  European Pat. Off. .
63-204627  8/1988  Japan .

Primary Examiner—Edward P. Westin
Assistant Examiner—Andrew Sanders
Attorney, Agent, or Firm—Cushman, Darby & Cushman

[57] ABSTRACT

A trimming circuit has a plurality of zener zap diodes, a group of switching devices for selectively zapping the zener zap diodes, and a decoder circuit for controlling the ON/OFF states of the switching devices.

24 Claims, 9 Drawing Sheets

TRIMMING CIRCUIT

FIELD OF THE INVENTION

The present invention relates generally to a trimming circuit, and more particularly, to an on-chip trimming circuit for semiconductor integrated circuits.

BACKGROUND OF THE INVENTION

As one means to correct device errors produced by the limited manufacturing accuracy of integrated circuits, e.g., analog integrated circuits, an adjusting method of on-chip trimming named "Zener Zap Trimming" has been known. This method uses a non-volatile ON/OFF switch which is, so to speak, writable only one time using a phenomenon that a zener diode is broken (zapped) and is permanently short-circuited if an electric pulse above a certain energy is applied to the zener diode in the reverse direction.

By prearranging some pieces of such zener diodes in a circuit, the zener diodes are used in the OFF (open-circuit) state under a bias condition so that the zener diodes do not close in the forward direction and no voltage above the zener voltage is added in the reverse direction if the zener diodes are not zapped. When making the trimming, while checking circuit errors, a designated point is decided and zapped and a total error is reduced by turning a combination of some proper zener diodes ON (short-circuited).

The most basic example of application of a conventional zener zap trimming is a resistor trimming. For this trimming, a resistor network is constructed by a plurality of resistors which are subject to the trimming and zener diodes are connected to these resistors in series or in parallel, and pads are arranged at both ends of each zener diode. A resistance error is corrected by deciding a proper combination of ON/OFF state of the zener diodes paired with the resistors and by zapping the resistor network.

Further, instead of the direct trimming of a resistor network, there is also an indirect trimming method to adjust a circuit subject to the trimming by a D/A output by constructing a network using a simple D/A conversion circuit and data to be input to this circuit can be set by the zener zap trimming. For instance, when this trimming circuit is used for an adjustable filter circuit, an oscillator or for time constant adjustment, it is possible to adjust at a common location several circuits whose time constant fluctuation is a problem and therefore, this trimming circuit is suited to such uses.

FIG. 1 shows a conventional circuit having a current output type D/A output as one example of the D/A conversion type trimming. A voltage-current converter is constructed by an operational amplifier B80 and a transistor Q80, reference voltage VB is constantly applied between the emitter of the transistor Q80 and GND and current converted according to a resistance between the emitter of the transistor Q80 and GND is output to a current output terminal T80 through the collector of the transistor Q80.

Therefore, by deciding the ON/OFF for connecting resistors R80b through R80d to GND by zener diodes Z81 through Z83, output current value obtainable at the terminal T80 can be varied. In this circuit example, an output current Iout can be varied in 8 kinds as follows by the combination of ON/OFF of zener diodes Z81 through Z83:

$$Iout = nVb/8R, \ (n=8, 9, 19, 11, 12, 13, 14, 15) \quad (1)$$

Pads P81 through P83 are for receiving zapping pulses and by applying voltage pulse to the pads corresponding to the zener diodes Z81 through Z83 from the outside, it becomes possible to short (ON) a designated point only.

Shown in FIG. 2 is an example of the zener diodes zapping circuit shown in FIG. 1. In this example, the zener diodes Z81 through Z83 have been substituted by switching transistors Q91 through Q93 and these switching transistors are controlled by the zener diodes Z91 through Z93.

When the zener diodes Z91 through Z93 have not been zapped, the switching transistors Q91 through Q93 are biased by resistors R91 through R93 and R94 through R96, and the switches are in the ON state. When the zener diodes have been zapped, bias current from Vcc is shorted to GND in the middle and therefore, no bias current is supplied to the switching transistors and the switches are in the OFF (open-circuit) state.

Thus, as in the example shown in FIG. 1, it is possible to vary the output current of the D/A conversion circuit by selectively zapping the zener diodes. However, the output current is reversed one time by the switching transistors Q91 through Q93, and the relationship between the zapping and the switch ON/OFF becomes contrary to the example in FIG. 1. This circuit is superior to the circuit shown in FIG. 1 in that current flowing to zener diodes in the short-circuited state after completing the zapping is easily restricted and the other point is that residual resistance and its fluctuation, even when large, scarcely affect D/A conversion output, and this circuit has a higher using value than the circuit shown in FIG. 1.

In the conventional circuit examples shown above, at least one zapping pad is needed for every zener diode. In the examples in FIGS. 1 and 2, as the anode terminal of zener diode is of GND type and a GND pad can be used when zapping, only one pad is required for zapping per zener diode. However, two pads may be required for each zener diode depending on a type of circuits. If the number of trimming points by zapping of zener diodes is increased or if the number of trimmings is increased in order to increase the number of trimming steps, the number of pads must be increased proportionally and therefore, economy will become remarkably worse. For instance, if there are an average five trimming points for 4 bits, more than 20 pads must be specially arranged for the zapping.

In such trimming according to the conventional zener diode zapping system, the trimming can be performed only in the wafer before assembling (before sealing in a package) an integrated circuit. This is so because in order to perform the trimming by zapping after assembling an IC, it is necessary to put all the zapping pads out as IC pins and as a result, the number of IC pins increases by at least the product of the number of trimming points and the number of average trimming bits. Such an arrangement is not practical.

However, a demand for trimming of IC in the state sealed in a package after assembled is strongly demanded mainly for the following four reasons.

The first reason is that if the trimming was performed in the wafer state, there is such a defect that the correction made by the trimming may shift and trimming accuracy cannot be promoted because of the effect of stress applied to the mount during the assembling and the piezoelectric effect of stress between an IC chip and resin when sealing in resin mold, and thus it is necessary to perform the trimming requiring a high accuracy in the state close to the final product form after assembled.

The second reason is that the ICs may be rejected as being faulty after a die-sorter test. Therefore, any trimming of ICs prior to such test may be unnecessary. The trimming by the zapping requires labor and cost and therefore, in particular, if a yield of good products in the test after assembled is worse, it will be more economically advantageous to perform the trimming after the test after assembly than to perform the trimming in the state of water.

The third reason is that when the trimming is performed while checking signals by putting ICs in The operating state, the ICs cannot be accurately checked in the wafer state as it is complicated. The trimming of ICs in the wafer state by the zapping is sufficient for the trimming of simple resistance value. Actually, however, the trimming is executed while checking a frequency characteristic and an amplitude characteristic in a considerably large scale circuit in many cases. In these cases, it is necessary to carry out the precise measurement and a high level of discrimination by an AC test instead of a simple DC test and a general purpose equipment of die sorter which is carried out on ICs in the wafer state is insufficient in many cases. In this point, the trimming after assembly allows a large degree of freedom from the viewpoint of equipment and operation.

The fourth reason is that there is such a case where equipment makers who are users of ICs perform the trimming of overall characteristic including fluctuation of a set not only the self-optimizing type trimming of simple ICs. In this case, manufacturing of products which allows the trimming by the zapping will become an absolute condition required for the zener zap trimming of integrated circuits.

As to the conventional trimming in ICs, it is strongly demanded to make the trimming on ICs in a form close to the final products after assembled from the viewpoints of in assuring trimming accuracy, economy, the degree of freedom for monitoring and measuring, trimming by use makers, etc. However, there was such a problem that in order to perform the trimming after assembling ICs according to the conventional zener zap trimming system, a large number of IC pins dedicated for the zener zapping are needed which is extremely uneconomical and not practical.

SUMMARY OF THE INVENTION

It is, therefore, an object of the present invention to provide a trimming circuit which enables the trimming to be easily performed after sealing the IC chips in packages and scarcely requires an increase the number of IC pins even when increasing the number of trimming points or subdividing trimming steps.

In order to achieve the above object, a trimming circuit according to one aspect of the present invention includes switches and a decoder circuit for controlling the switches as a zapping control circuit for reducing IC pins required for zapping zener diodes and the path of zapping pulses applied from the outside is decided by the switch control state.

Use of the switches and decoder circuit described above eliminates a pad for receiving zapping pulse for every zener diode and requires only one commonn pad shared for the diodes for receiving a zapping pulse. Thus, the number of pads scarcely increases even if trimming points increased or trimming steps were further subdivided and therefore, and it becomes easy to make the trimming after sealing the ICs in packages while scarcely increasing the number of IC pins.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention end many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
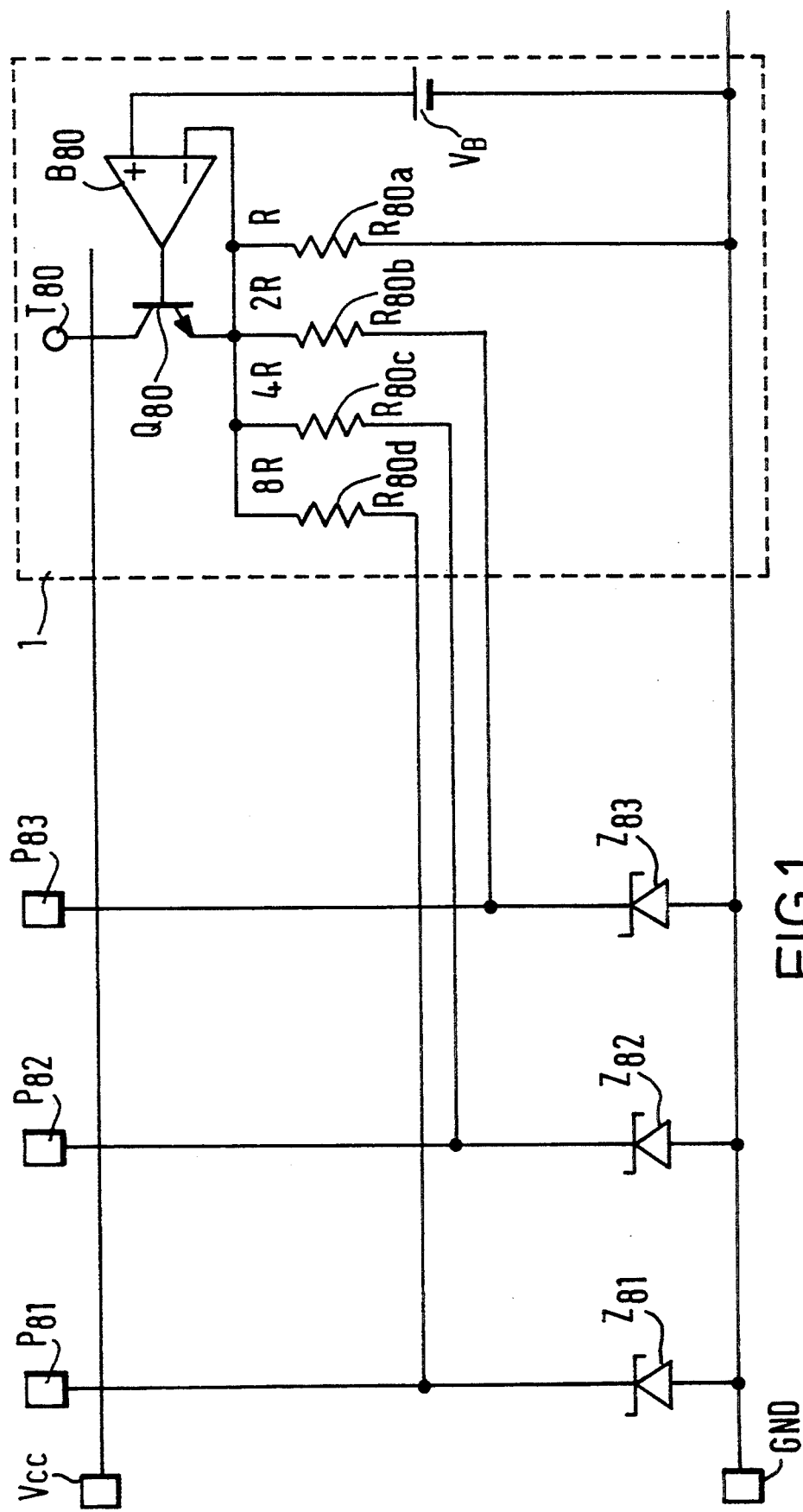
FIG. 1 is a circuit diagram showing a conventional trimming circuit using zener zap diodes.
Figure 2:
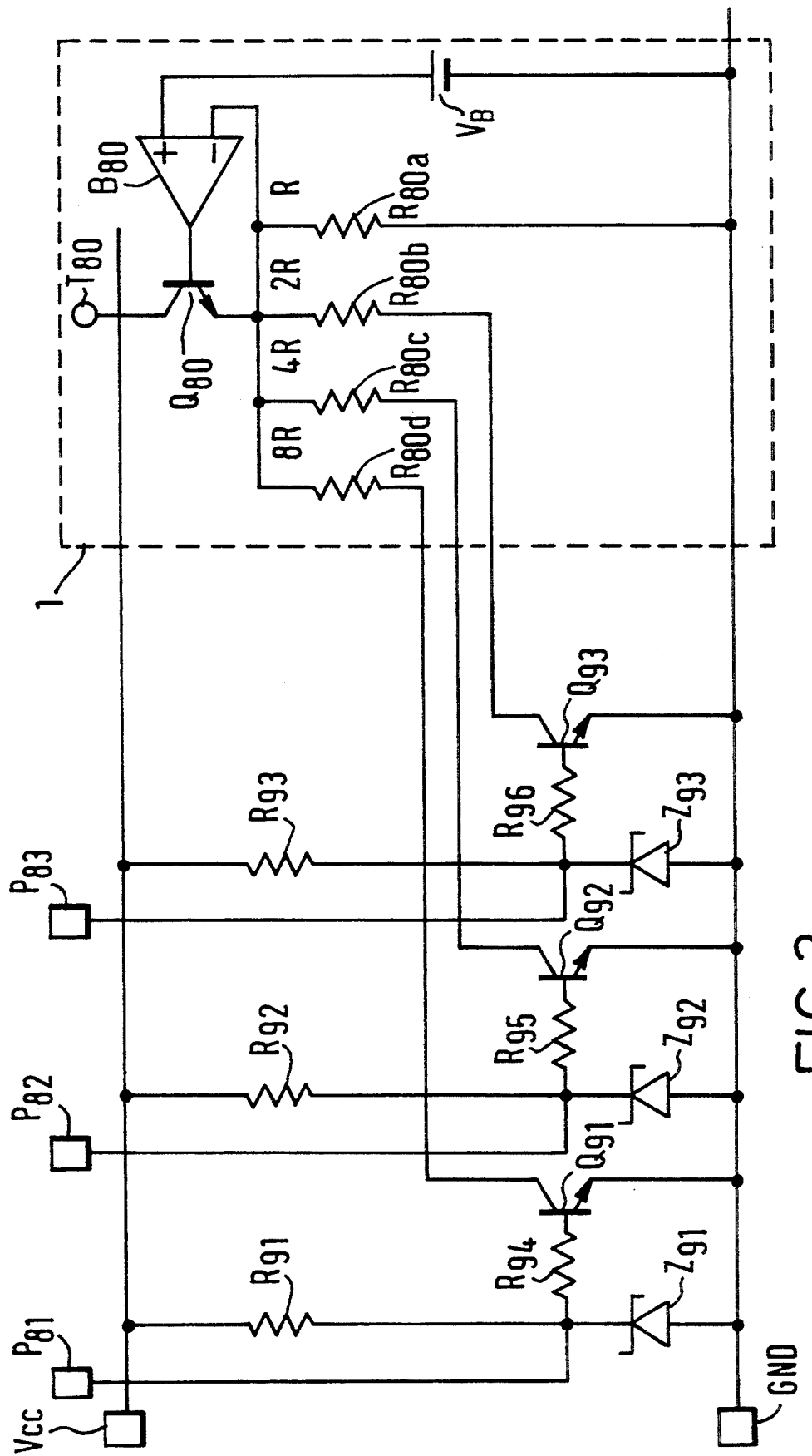
FIG. 2 is another circuit diagram showing a conventional trimming circuit using zener zap diodes.

The present invention will be described in detail with reference to the FIGS. 3 through 9. Throughout the drawings, reference numerals or letters used in FIGS. 1 and 2 will be used to designate like or equivalent elements for simplicity of explanation.

Figure 3:
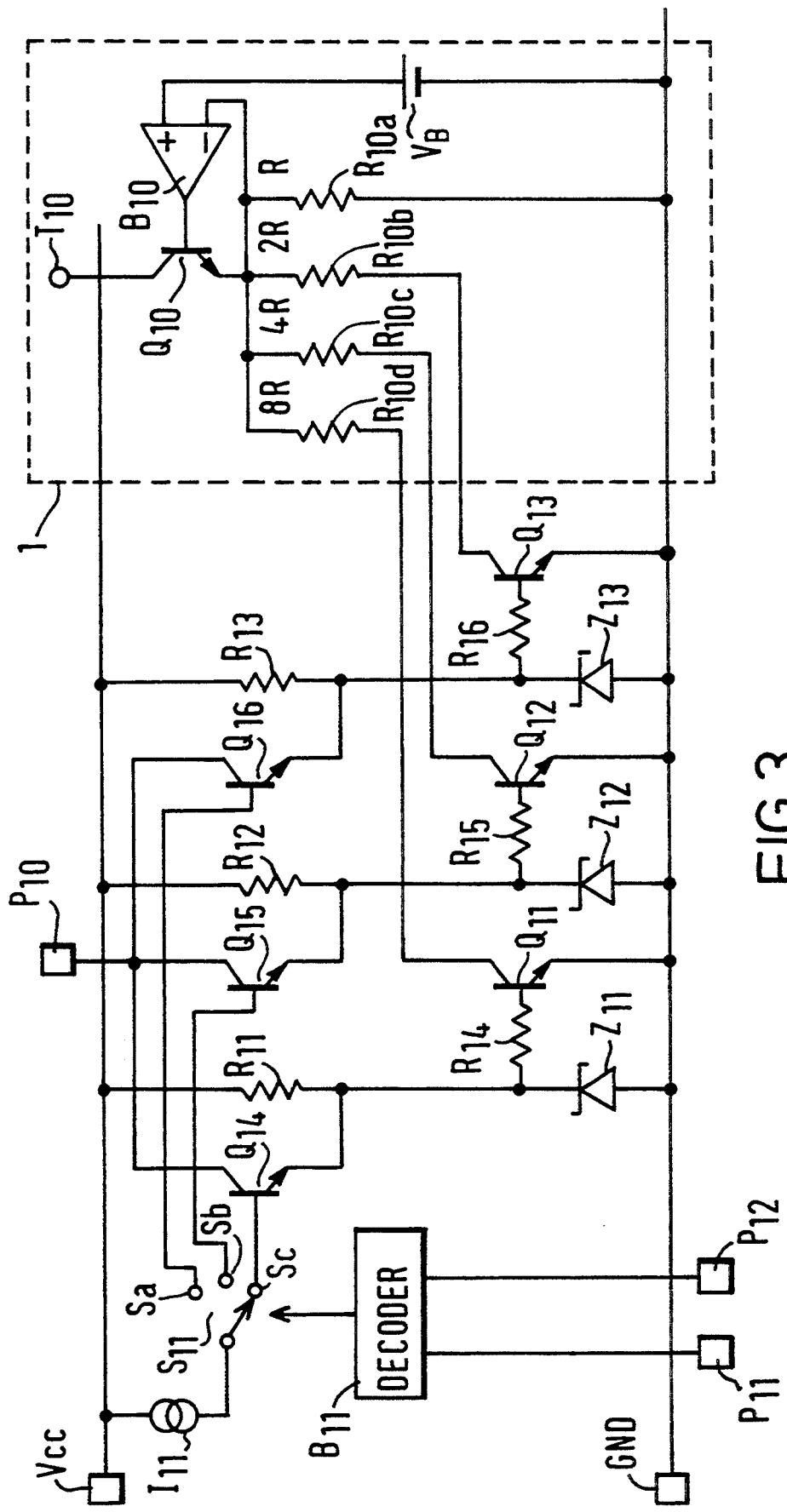
FIG. 3 is a circuit diagram showing an embodiment of the trimming circuit according to the present invention.

FIG. 3 shows one embodiment of the trimming circuit according to the present invention. The concept of trimming by the zener diode zapping circuit shown in FIG. 2 has been directly applied to this embodiment.

A circuit subject to the trimming is a current output type D/A conversion circuit 1, which is composed of an operational amplifier B10, transistor Q10, resistors R10a through R10d and transistors Q11 through Q13 as adjusting switches. The point of the ON/OFF state of the switching transistors is decided by zener diodes Z11 through Z13 while supplying bias to the transistors Q11 through Q13 by a circuit composed of the resistors R11 through R16 is the same as FIG. 2. An important point of the present invention is that transistors Q14 through Q16 have been arranged as switches for deciding the path of electric pulse while in the conventional trimming, zener diodes are zapped by applying electric pulse to pads which are provided to the cathode terminals of zener diodes.

Thus, only one pad is sufficient for receiving zapping pulse to the zener diodes Z11 through Z13 and this pad is a pad P10 shown in the drawing. The number of pads has been reduced by providing the switch S11 for deciding the ON/OFF state of a bias source I11 and switching transistors for driving these transistors and a decoder B11 for controlling the switch S11.

Now, in the zapping mode, an output of the decoder circuit B11 controls the switch S11 to turn to Sc based on the data input to the pads P11 and P13 and bias current is supplied to only the transistor Q14 out of the zapping switching transistors. If a current pulse for zapping is applied to the pad P10 under this state, this current pulse flows to the zener Z11 through the collector and emitter of the transistor Q14 as only the transistor Q14 is in the ON state in the switching transistors.

Therefore, if that current pulse has satisfied more than certain zapping conditions, the zener diode Z11 of three zener diodes only is changed to the short-circuit state. As a result, a path to bypass bias current supplied by the transistor Q14 and the resistor R11 to GND is created and output current is slightly reduced when only the transistor Q11 equivalent to the lowest bit out of the transistors Q11 through Q13 is turned OFF. If a value of each of the resistors R10a through R10d for current regulation of the D/A conversion circuit 1 is weighted by 2n, it is possible to change the output current linearly against digital set data.

By performing the zapping at points equivalent to the optimum data according to the zapping procedures described above, it is possible to suppress an output current error to between a certain resolution which is decided by the number of bits for the number of zener diodes. As there are three zener zap diodes in FIG. 3, 3 bits are adjustable and when compared with a case where an output current error is not adjustable, it becomes possible to suppress the resolution to ⅛ or below by making a proper trimming.

In this case, the number of pads for zapping is reduced by controlling the encoder but an input pad for setting the decoder adjusting data is newly needed. In this embodiment, as three points are controlled, at least 2 bits coded input data become necessary. These terminals correspond to the pads P16 and P17, as shown in the drawing.

However, when compared with the conventional method in which one pad was needed for every zener diode, even when the number of points subject to the trimming and the number of trimming steps increased, it is nor necessary to increase the number of pads proportionally. The more zener diodes are increased, the more the reduction effect of the number of pads by the decoder system becomes remarkable. For instance, when trimming data for 8 bits, required decoder input is 3 bits, that is, only three pads are required and for trimming data for 8 bits at 8 points, that is, a total 64 bits, the required decoder input is 6 bits, that is, only 6 pads are required.

Thus, the pad reduction effect is further increased when a serial bus control is used for the zapping control, This is achieved by substituting the decoder circuit B11 with a serial bus decoder circuit. For instance, when 2-wire type serial buses for data and clock are used, only two pads are needed for control data input no matter how many zener diode are increased.

As the zener zap trimming can be realized with less pads, it has become possible to make all of these pads to IC pins and as a result, it will become possible to make the trimming after scaling IC chips in packages. As already described above, this method of trimming is excellent in that the accuracy of the trimming is promoted as the trimming error due to the piezo effect between IC chips and resin when sealing IC chips with resin can be eliminated and further, the zapping is easy to perform.

Figure 4:
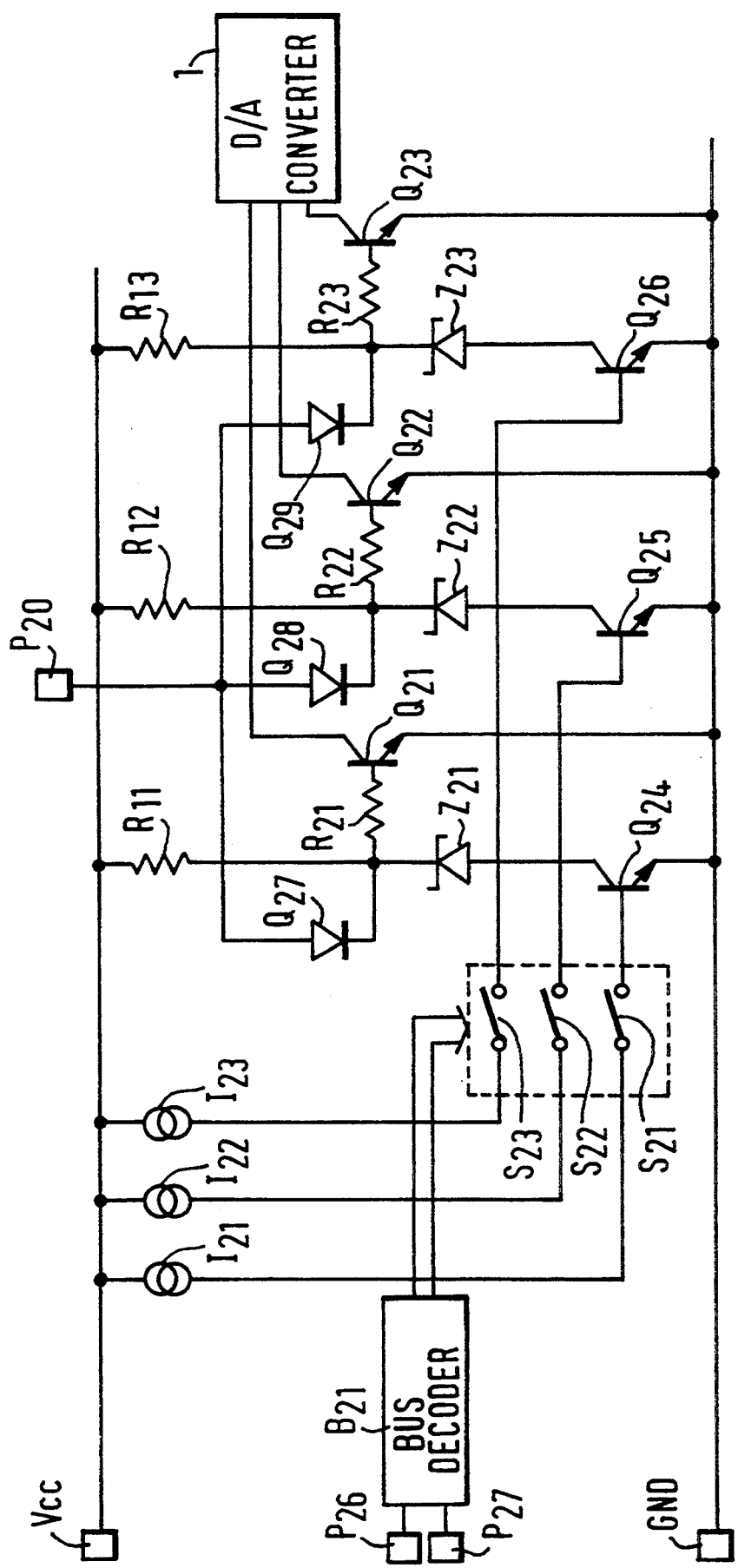
FIG. 4 is a circuit diagram showing a first modification of the trimming circuit shown in FIG. 3.

FIG. 4 shows a first modification of the trimming circuit according to the present invention. This modification is the same as the embodiment show in FIG. 3 in that zener zap diodes at several points are zapped through only one zapping pad by controlling the zapping current pulse bus using transistor switches. This modification differs from the circuit shown in FIG. 3 in that the switching transistors have been arranged between zener zap diodes and GND.

That is, transistors Q24 through Q26 act as switches for controlling the zapping of zener zap diodes Z21 through Z23. Transistors Q24 through Q26 control ON/OFF of adjusting switches for a systems of resistors R11 end R21 and the transistor Q21. Thus, according to the state of the group of adjusting switches, it is possible to make the trimming of a circuit, for instance, the D/A conversion circuit 1, connected to the adjusting switch group.

In this case, diodes Q27 through Q29 have been provided to separate control ends of respective adjusting switches. Further, as the ON/OFF state of respective adjusting switches must be decided based on whether zener diodes are short-circuited when ICs are actually in the operating state after completing the trimming by zapping the zener diodes, all the switching transistors for zapping must be in the ON state. That is, in the actual operating state, driving currents I21 through I23 should have, the switching transistors Q24 through Q26 turned ON, respectively.

The operation for actually performing the zapping will be explained using en assumption to make the zapping of the zener diode Z22. Zapping control data are input as data and clock from pads P26 and P27 through a two-wire type serial bus. The merits of the control by the serial bus are as described in detail in the embodiment shown in FIG. 3. This input is converted by a bus decoder B21 and only the switch S22 equivalent to the zener diode Z22, out of the control switches of the switching transistors for zapping is turned ON.

As a result, driving current is supplied to the switching transistor Q26 only and Q25 only is put in the ON state. If zapping current pulse is applied to a pad P20, the current flows through Q28 - Z22 - Q25 - GND in that order and the zener zap diode Z22 is short-circuited. When actually operating an IC, bias supplied to the adjusting switches from the resisters R12 and R22 is bypassed to GND by the zener diode Z22 and the transistor Q25, and the IC is operated by turning the central switch Q22 only OFF out of three adjusting switches.

In this first modification, the switches for zapping control are-arranged at the anode sides of the zener diodes, that is, at the GND side while they are arranged at the cathode sides of the zener diodes, that is, the zapping pulse receiving pads side in the embodiment shown in FIG. 3. In general, voltage applied to zener diodes when performing the zener zapping may reach several tens of volts and therefore, their control switches must withstand relatively high voltages. In the circuit illustrated in FIG. 3, as control transistors Q14 through 016 have been arranged at the high voltage side of the zener diodes, they must withstand high voltage.

In this first modification, as the control transistors Q24 through Q26 have been arranged at the low voltage side of the zener diodes, they are more advantageous than the transistors Q14 through Q16 shown in FIG. 3. However, even in this case, a considerably high voltage is applied to the control transistors Q24 through Q26. That is, in an example to zap the zener diode Z22, voltage as high as several tens of volts is generated at the pad P20. If this voltage is higher than the withstanding voltage between the collectors and the emitters of the transistors Q24 through Q26, these transistors may be broken and zapping current being supplied to the pad. P10 is branched to the diodes Z21 and Z23 side and sufficient zapping cannot be made. In particular, if the diode Z21 or Z23 has been already zapped and in the short-circuited state, a high voltage generated at the pad P20 in the zapping is fully applied directly to the control switching transistor Q24 or Q26 and therefore, the voltage at the pad P20 does not rise above breakdown voltage and because of this, the zapping may not be executed.

In this modification, the zapping cannot be accurately carried out or the zapping can be made at only one point if the zapping control transistors have low withstand voltage.

Figure 5:
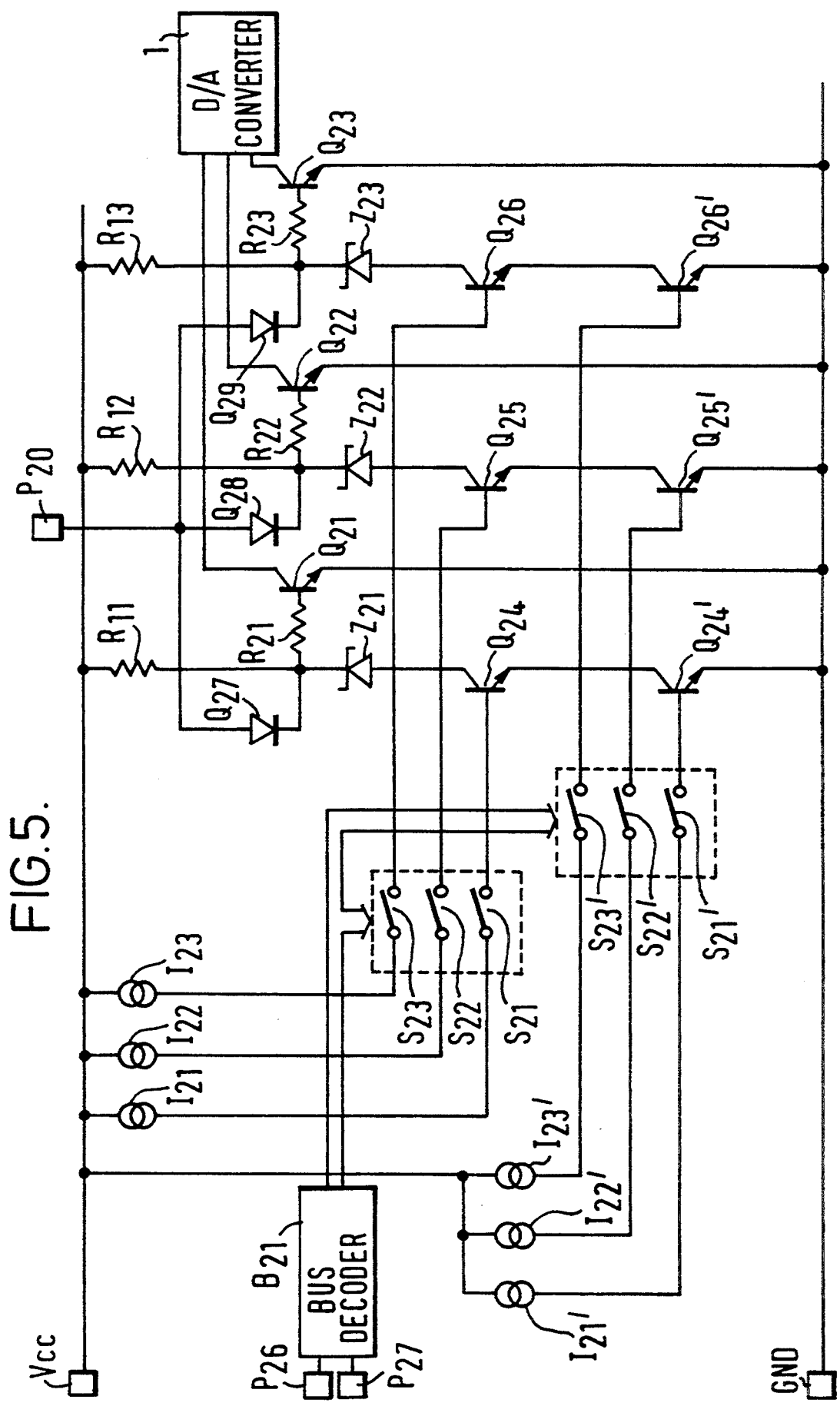
FIG. 5 is a circuit diagram showing a second modification of the trimming circuit shown in FIG. 3.

FIG. 5 shows a second modification of the trimming circuit according to the present invention, In this modification, control transistors have been cascaded in series to get a sufficient withstand voltage in total and the zapping can be performed even when a low withstand voltage semiconductor process is used.

In FIG. 5, the ON/OFF operations of control transistors Q24 and 24', Q25 and Q25', and Q26 and Q26' are controlled by interlocking switches S21 and S21', S22 and S22', and S23 and S23'.

In general, such the cascade connected construction of the transistors Q24 and Q24', Q25 and Q25', and Q26 and Q26' can increase the withstand voltage at the collector end of each control transistor to a considerably higher collector-to-substrate withstand voltage than collector-to-emitter withstand voltage.

It is to be understood that for a current pulse to be applied for zapping, current as large as several tens mAs is required. This current is considerably large for an IC. On the other hand, a control circuit at a decoder circuit or a bus decoder circuit cannot take out so large driving current in many cases because such a circuit as I2L, CMOS, etc. is used. Actually, therefore, combined transistors in two-stage Darlington construction or in three-stage Darlington construction are used for the transistors Q24 through Q26 shown in FIG. 4.

Figure 6:
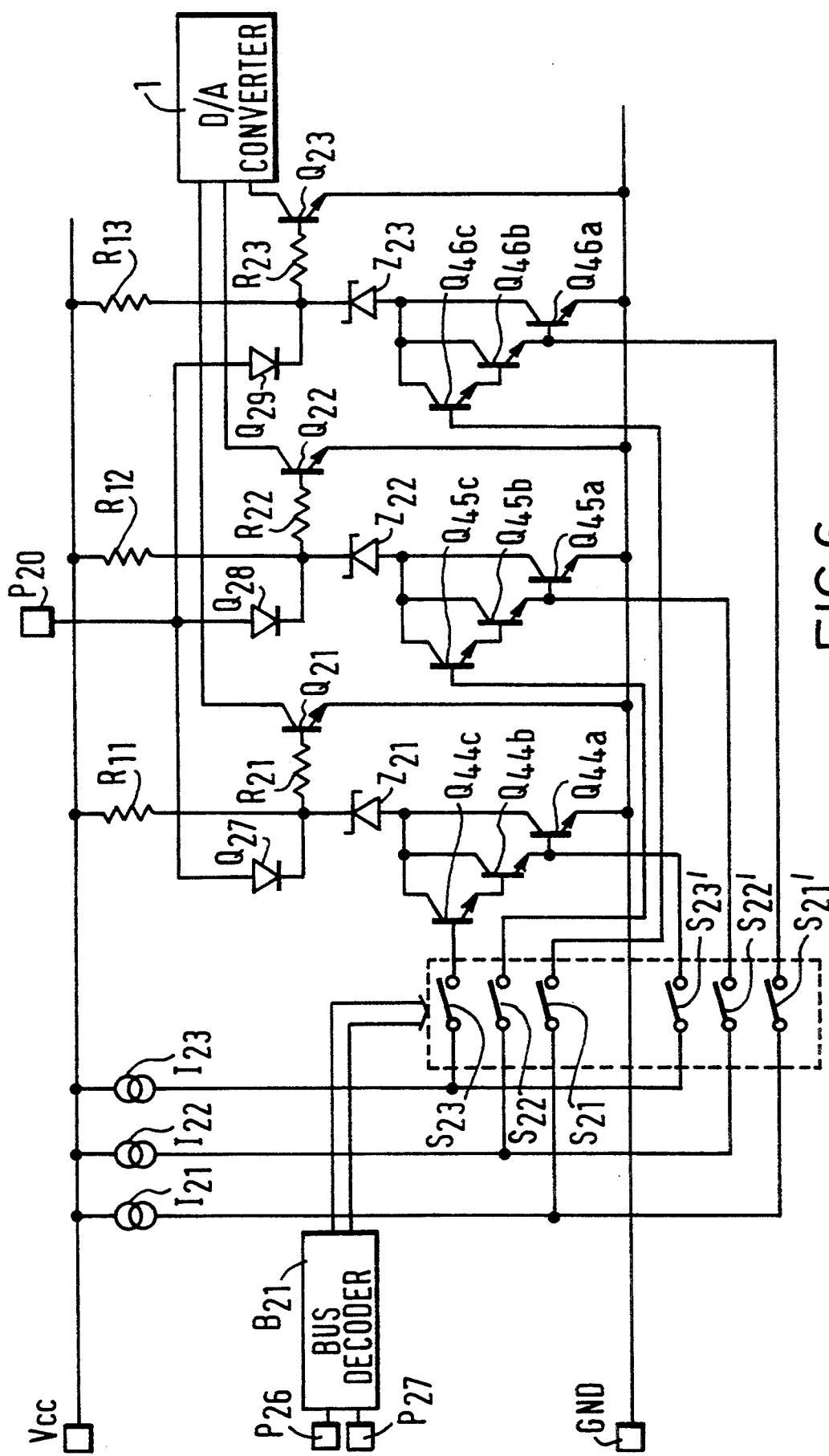
FIG. 6 is a circuit diagram showing a third modification of the trimming circuit shown in FIG. 3.
Figure 7:
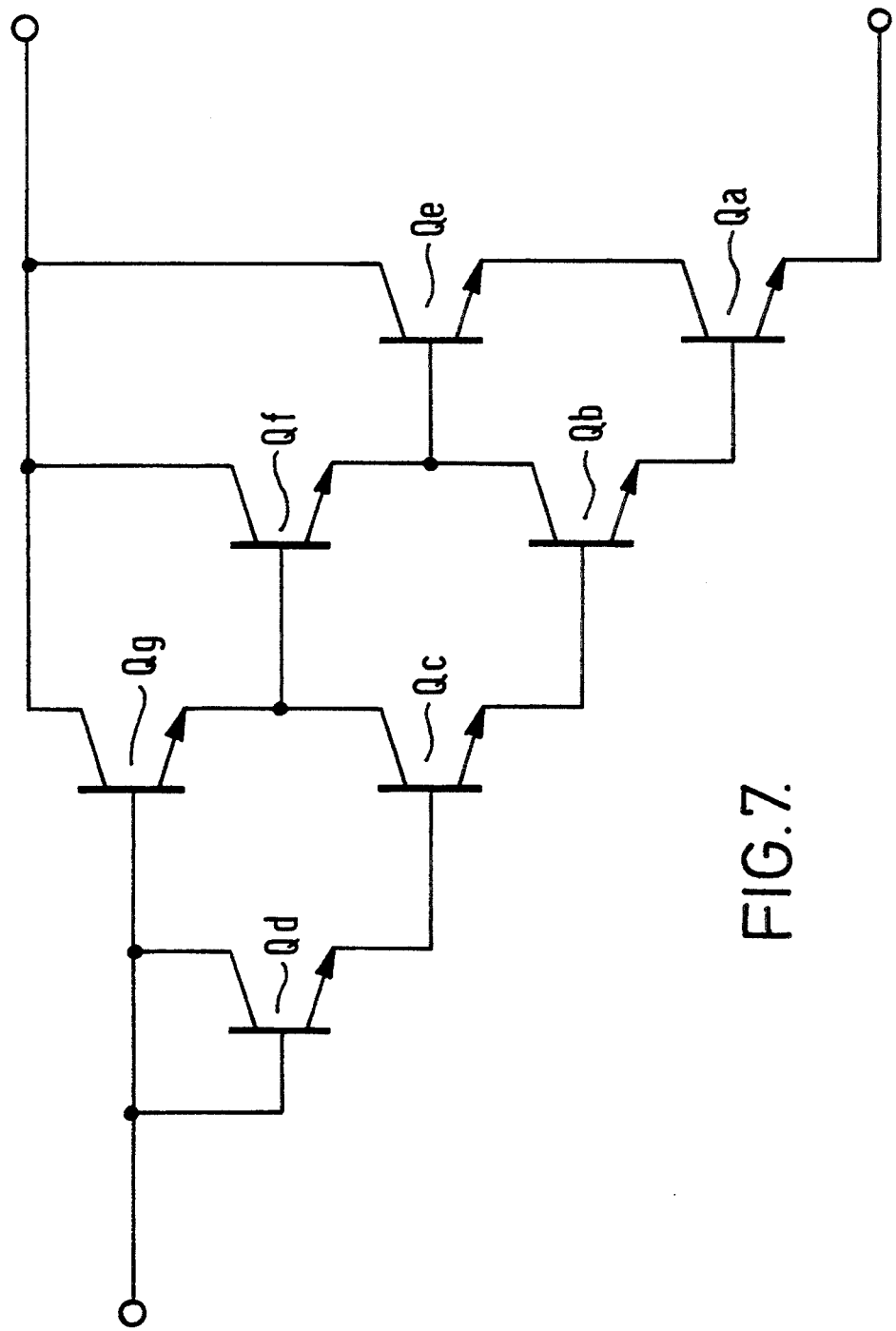
FIG. 7 is a circuit diagram showing a state with transistors for withstanding voltage cascade connected to the Darlington configuration shown in FIG. 4.

FIG. 6 shows a third modification of the trimming circuit according to the present invention. In this modification, the transistors Q24 through Q26 of the zener zap control circuit shown in FIG. 4 are changed to three-stage Darlington connected transistors of Q44a through Q44c, Q45a through Q45c, and Q46a through 46c.

The use of the three-stage Darlington construction makes switching of large current pulse possible even when the driving current at the control circuit side is small. Further, when actually operating an IC after completing the zapping, it is only necessary to keep the transistors at the last stage of the Darlington construction in the ON state, that is, it is only necessary to keep the transistors Q44a, Q45a and Q46a shown in FIG. 6 in the ON state by supplying bias current to their bases.

When switches in such three-stage Darlington construction are used, if the withstand voltage of the transistors constructing the circuit becomes a problem, this problem can be solved by using switches comprising transistors Qe through. Qg shown in FIG. 7 in Darlington connection and transistors Qa through Qc including the transistor Qd in a cascade connection.

Figure 8:
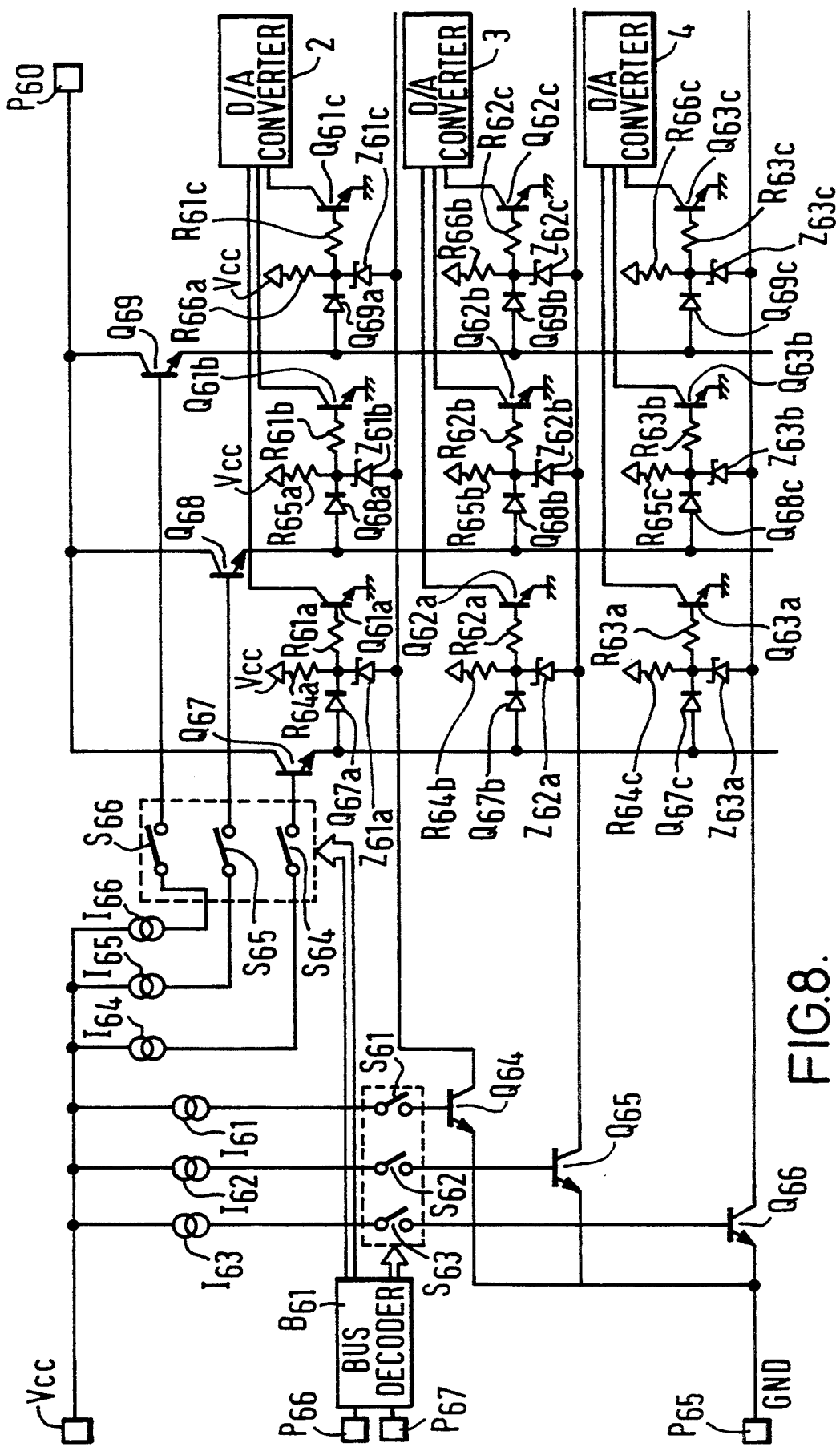
FIG. 8 is a circuit diagram showing a fourth modification of the trimming circuit shown in FIG. 3.

FIG. 8 shows a fourth modification of the trimming circuit according to the present invention. In this modification, switching transistors for zapping control have been provided at both the anode side and the cathode side of zener zap diodes.

In this fourth modification, a wiring matrix is formed and a device combining a diode and a zener diode similar to the example shown in FIG. 4 is inserted at each crossing location. Wiring lines at respective lines and rows are driven by switching transistors and only zener diodes positioned in the current bus designated the switching transistor groups of the lines and rows are zapped.

FIG. 8 is an example of a 3×3 zapping matrix, The relationship among zener zap diodes Z61a through Z61c, Z62a through Z62c, and Z63a through Z63c and the adjusting switches of D/A conversion circuits 2 through 4 is the entirely same as the circuit shown in FIG. 4. Switching transistors Q64 through Q66 are arranged at the anode sides of the zener diodes for the zapping and the base ends of these zener diodes are controlled for the line driving current sources I61 through I63 and switches S61 through S63. On the other hand, switching transistors Q67 through Q69 are arranged at the cathode side and the base ends these zener diodes are controlled for the row driving by current sources I64 through I66 and switches S64 through S66.

Thus, the current bus running through the intersecting point of the line designated by one of the switches S61 through S63, which is turned ON and the row designated one of the switches S64 through S66, which is turned ON is produced between a zapping pulse receiving pad P60 and a GND pad P65. Further, when actually operating an IC after completing the zapping, all of the switches S61 through S63 must be turned ON and the line driving switching transistors Q64 through Q66 must be kept ON by the driving current I61 through I63. This point is the same as the second modification as shown in FIG. 4. The line and row driving control switches S61 through S66 are controlled by decoding data input from pads P66 and P67 and two-wire serial bus clock data by a bus decoder B61.

Now, the zapping will be explained based on the assumption that only a zener zap diode Z61a out of the zapping matrix is zapped. Zapping control data are input as data and clock by pads 66 and 87 through a two-wire serial bus. This input is parallel converted by the decoder B61 and turns only the control switches S61 and S64 for the zapping switching transistors. Thus, driving current is supplied to only the transistors Q64 and Q67 which are turned ON. If current pulse for zapping is applied to the pad P60 in this state, the current flows through P60, Q67, Q67a, Z61a, Q64 and P65 (GND) in that order, and the zener diode Z61a only is short-circuited.

Therefore, when actually operating an IC, adjusting switch bias supplied by the resistors R64a and R61a is entirely bypassed to the GND by the zener diode Z61a and the transistor Q64, and the IC is operated with only the upper left transistor Q61a and of 9 adjusting switches turned OFF.

In this fourth modification, the method to construct a matrix-shaped zapping circuit by line and row switching transistors is useful in reducing the number of switching transistors and a scale of its driving circuit.

Further, when making the zapping of nine zener diodes, if the zapping matrix from is used, only six switching transistors and a driving circuit of these transistors are needed. If the zapping circuit is not in the matrix form as shown in FIG. 4, nine switching transistors and a driving circuit of the transistors are required. The more the number of zener diodes is, the more this effect becomes remarkable. For instance, when zapping 64 zener diodes, switching transistors and their driving circuit can be reduced to minimum 16 pieces of switching transistors (in case of a 8×8 matrix) from 64 pieces if the circuit is made to the matrix form as shown in FIG. 8.

In the embodiment and its modifications as described above, the trimming circuit using the zener diode zapping has been explained. The present invention is not limited to the trimming circuit using the zener diode zapping but can be applied to a trimming circuit using fuse resistors. To be concrete, this trimming circuit using fuse resistors can be realized simply by replacing the zener diodes shown in the zener zapping trimming circuit described above directly with fuse resistors.

Figure 9:
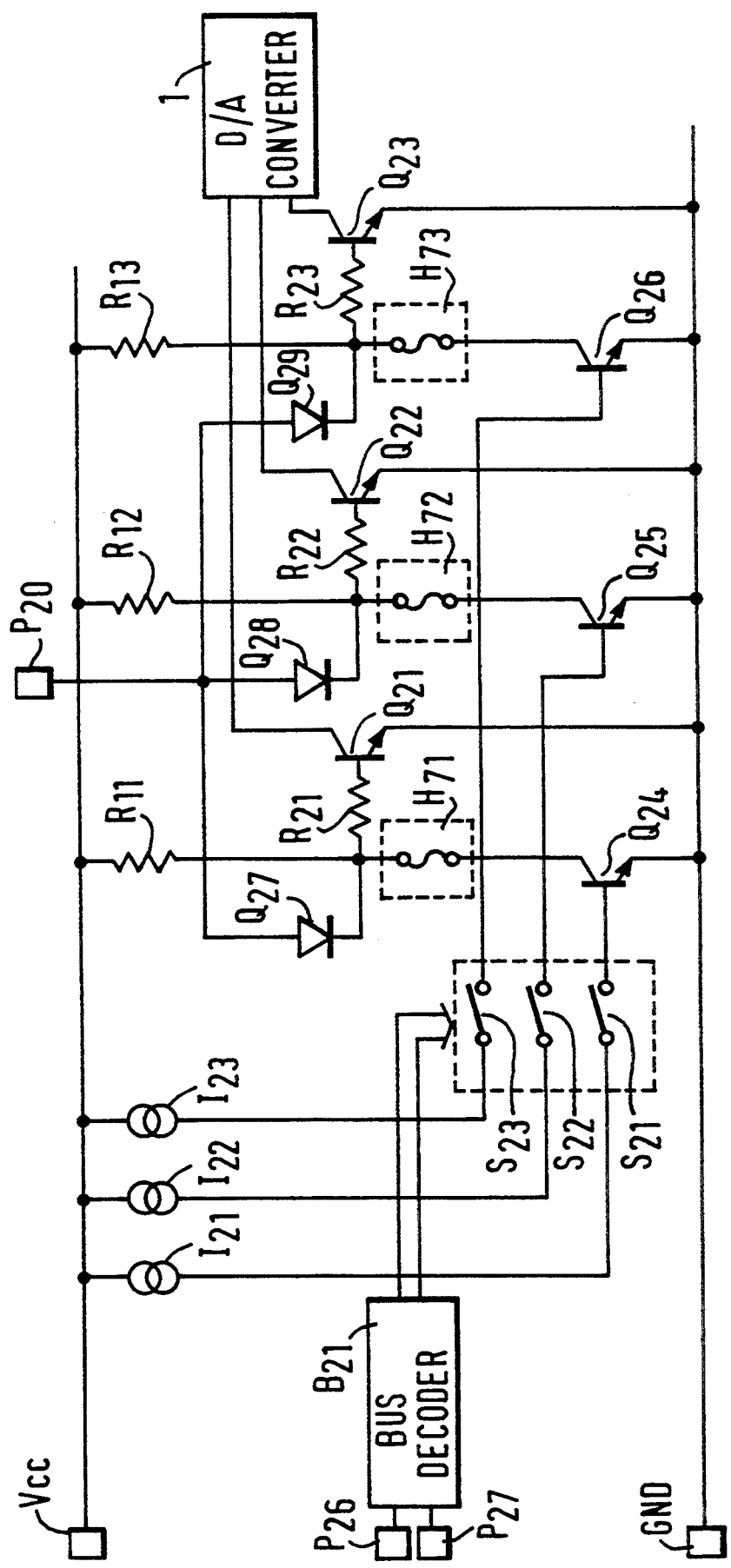
FIG. 9 is a circuit diagram showing a fifth modification of the trimming circuit shown in FIG. 3.

FIG. 9 shows a fifth modification of the trimming circuit according to the present invention. Except that zener zap diodes Z21 through Z23 in the trimming circuit for the zener diode zapping shown in FIG. 4 were replaced by fuse resistors H71 through H73, the construction of the circuit in this fifth modification is entirely the same as the circuit shown in FIG. 4.

The point that using transistors Q24 through Q26 controlled by a decoder circuit B21 using only one pad P20, as many points as needed can be fuse trimming is the same as the zener diode zapping trimming circuits of the embodiment and its modifications as described above. However, which the zener diodes designed for zapping will be short-circuited in case of the zener diode zapping, the designated points will change from a resisting conductive state to an open state in case of the trimming circuit using fuse resistors.

As the fuse resistors H71 through H73 before trimming are in the conductive state, the adjusting switching transistors Q21 through Q23 are in the OFF state in contrast with the zener diodes. In the same manner as in the zener diode zapping, data to the applied to the pad P20 is decoded by the bus decoder B21, one of the control switches S21 through S23 and a corresponding control switching transistor out of Q24 through Q26 are turned ON and then, by applying current pulse to the pad P20, a corresponding fuse resistor can be changed to the open state.

Thus, the trimming of the D/A conversion circuit 1 can be trimmed in the same manner as in the zener diode zapping.

Further, when actually operating an IC after completing the trimming, the switches S21 through S23 for reading trimming data must be turned ON and the trimming control transistors Q24 through Q26 must be kept ON. This is also the same as the zener diode zapping.

As described above, according to the trimming circuit of the present invent/on, it is possible to reduce the number of zapping pads, provide all of these pads as IC pins and perform the zapping after scaling an iC chip in a package by constructing a group of switches for a zapping circuit and a decoder circuit for controlling the switches in an analog integrated circuit. Thus, the present invention can provide an extremely preferable trimming circuit.

While there have been illustrated and described what are at present considered to be preferred embodiments of the present invention, it will be understood by those skilled in the art that various changes end modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invent/on not be limited to the particular embodiment disclosed as the best mode contemplated for carrying out the present invention, but that the present invention include all embodiments falling within the scope of the appended claims.

What is claimed is:

1. A trimming circuit comprising:
a plurality of zener zap diodes;
a group of switching devices for selectively zapping the zener zap diodes, wherein each switching device in the group of switching devices is connected to at least one zener zap diode in the plurality of zener zap diodes; and
a decoder circuit providing a control signal to the group of switching devices for setting the ON/OFF states of the switching devices.

2. A trimming circuit comprising:
a plurality of zener diodes, each zener diode in the plurality of zenner diodes having a first electrode connected to a reference potential and a second electrode connected to a common terminal;
a group of switching devices, wherein at least one switching device in the group of switching devices is inserted between the second electrode of each of the zener zap diodes and the common terminal for receiving a zapping pulse; and
a decoder circuit providing a control signal to the group of switching devices for setting the ON/OFF states of the switching devices at a zapping operation.

3. A trimming circuit comprising:
a plurality of switching devices;
a plurality of zener zap diodes, each zener diode in the plurality of zenner diodes having a first electrode connected to a reference potential through at least on of the switching devices and a second electrode connected to a common terminal;
a group of diodes, wherein at least one diode is inserted between the second electrode of each respective zener zap diodes and the common terminal for receiving a zapping pulse; and
a decoder circuit providing a control signal to the plurality of switching devices for setting the ON/OFF states of the switching devices when zapping the zener zap diodes.

4. A trimming circuit comprising:
a plurality of fuse resistors;
a group of switching devices for selectively zapping the fuse resistors, wherein each switching device in the group of switching devices is connected to at least one fuse resistor in the plurality of fuse resistors; and a decoder circuit providing a control signal to the group of switching devices for setting the ON-/OFF states of the switching devices.

5. A trimming circuit comprising:

a wiring matrix having a plurality of rows connected to a common terminal and a plurality of columns connected to a reference potential, wherein an intersection of each row and column defines a crossing location;

a first group of switches connected in the rows of the wiring matrix;

a second group of switches connected in the columns of the wiring matrix;

a plurality of zapping devices, wherein at least one zapping device in the plurality of zapping devices is provided at each crossing location of the wiring matrix; and a decoder circuit connected to the first group of switches and the second group of switches for controlling the ON/OFF state of the first and second group of switches for selectively zapping the zapping devices.

6. A trimming circuit as defined in claim 1, wherein one of an independent transistor or at least two, transistors connected in a Darlington configuration are used as switching devices and their ON/OFF state is controlled based on whether a base current is supplied or not.

7. A trimming circuit as defined in claim 2, wherein one of an independent transistor or at least two transistors connected in a Darlington configuration are used as switching devices and their ON/OFF state is controlled based on whether a base current is supplied or not.

8. A trimming circuit as defined in claim 3, wherein one of an independent transistor or a plurality of Darlington connected and combined transistors are used as switching devices and their ON/OFF state is controlled based on whether a base current is supplied or not.

9. A trimming circuit as defined in claim 5, wherein one of an independent transistor or a plurality of Darlington connected and combined transistors are used as switching devices and their ON/OF state is controlled based on whether a base current is supplied or not.

10. A trimming circuit as defined in claim 1, wherein the decoder circuit controls the zapping state by serial data using a serial bus decoder.

11. A trimming circuit as defined in claim 2, wherein the decoder circuit controls the zapping state by serial data using a serial bus decoder.

12. A trimming circuit as defined in claim 3, wherein the decoder circuit controls the zapping state by serial data using a serial bus decoder.

13. A trimming circuit as defined in claim 5, wherein the decoder circuit controls the zapping state by serial data using a serial bus decoder.

14. A trimming circuit as defined in claim 3, wherein in the group of switching devices inserted between the zener zap diodes and reference potential out of the group of switching devices, all switches are kept in the ON state in the normal operation after zapping the zener zap diode.

15. A trimming circuit as defined in claim 5, wherein in the group of switching devices whose one ends are connected to reference potential, all of the switches are kept in the ON state in the normal operation after the zener zap trimming.

16. A trimming circuit as defined in claim 1, wherein one of a combination of gang controlled transistors or a plurality of gang controlled transistors connected in series are used as switching devices.

17. A trimming circuit as defined in claim 2, wherein one of a combination of gang controlled transistors or a plurality of gang controlled transistors connected in series are used as switching devices.

18. A trimming circuit as defined in claim 3, wherein one of a combination of gang controlled transistors or a plurality of gang controlled transistors connected in series are used as switching devices.

19. A trimming circuit as defined in claim 5, wherein one of a combination of gang controlled transistors or a plurality of gang controlled transistors connected in series are used as switching devices.

20. A trimming circuit as defined in claim 2, wherein fuse resistors are substituted for the zener zap diodes.

21. A trimming circuit as defined in claim 3, wherein fuse resistors are substituted for the zener zap diodes.

22. A trimming circuit as defined in claim 5, wherein each zapping device in the plurality of zapping devices includes fuse resistors.

23. A trimming circuit as defined in claim 5, wherein each zapping device in the plurality of zapping devices includes at least one diode having a first electrode and a second electrode and at least one zener zapping diode having a first electrode and a second electrode, the first electrode of the at least one diode and the first electrode of the at least one zener zapping diode being connected to one another, and the second electrode of the at least one diode and the second electrode of the at least one zener zapping diode being connected to one of the rows and one of the columns in the wiring matrix.

24. A trimming circuit as defined in claim 5, wherein the each zapping device in the plurality of zapping devices includes at least one diode having an anode and a cathode and at least one zener zapping diode having an anode and a cathode, the cathode of the at least one diode and the cathode of the at least on zener zapping diode being connected to one another, and the anode of the at least one diode and the anode of the at least on zener zapping diode being connected to one of the rows and one of the columns in the wiring matrix.

* * * * *